(12) United States Patent
Miyagawa et al.

(10) Patent No.: US 8,835,896 B2
(45) Date of Patent: Sep. 16, 2014

(54) NONVOLATILE VARIABLE RESISTANCE ELEMENT

(71) Applicant: Kabushiki Kaisha Toshiba, Tokyo (JP)

(72) Inventors: Hidenori Miyagawa, Yokohama (JP); Shosuke Fujii, Fujisawa (JP); Akira Takashima, Fuchu (JP); Daisuke Matsushita, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/970,169

(22) Filed: Aug. 19, 2013

(65) Prior Publication Data

US 2013/0328009 A1    Dec. 12, 2013

Related U.S. Application Data

(63) Continuation of application No. PCT/JP2011/076598, filed on Nov. 11, 2011.

(30) Foreign Application Priority Data

Feb. 18, 2011 (JP) ................................. 2011-032875

(51) Int. Cl.
  *H01L 47/00* (2006.01)
(52) U.S. Cl.
  USPC .............................................. 257/4; 257/154
(58) Field of Classification Search
  CPC ....... H01L 45/04; H01L 45/08; H01L 45/146; H01L 45/1253; H01L 27/24
  USPC .................................................... 257/4, 154
  See application file for complete search history.

(56) References Cited

U.S. PATENT DOCUMENTS

| | | | | |
|---|---|---|---|---|
| 6,809,362 | B2 * | 10/2004 | Gilton | 257/296 |
| 2005/0121697 | A1 * | 6/2005 | Ishida et al. | 257/200 |
| 2007/0008865 | A1 * | 1/2007 | Adams et al. | 369/126 |
| 2007/0176264 | A1 * | 8/2007 | Lee et al. | 257/614 |
| 2009/0014707 | A1 | 1/2009 | Lu et al. | |
| 2009/0147558 | A1 * | 6/2009 | Tamai et al. | 365/148 |
| 2010/0006813 | A1 * | 1/2010 | Xi et al. | 257/4 |

(Continued)

FOREIGN PATENT DOCUMENTS

| | | |
|---|---|---|
| JP | 2007-165474 | 6/2007 |
| JP | 2011-238875 | 11/2011 |
| WO | 2009/078251 | 6/2009 |
| WO | 2011/071009 | 6/2011 |

OTHER PUBLICATIONS

U.S. Appl. No. 13/967,885, filed Aug. 15, 2013, Miyagawa et al.
U.S. Appl. No. 14/022,732, filed Sep. 10, 2013, Ishikawa et al.

(Continued)

*Primary Examiner* — Jarrett Stark
*Assistant Examiner* — John M Parker
(74) *Attorney, Agent, or Firm* — Oblon, Spivak, McClelland, Maier & Neustadt, L.L.P.

(57) ABSTRACT

According to one embodiment, a nonvolatile variable resistance element includes a first electrode, a second electrode, a variable resistance layer, and a dielectric layer. The second electrode includes a metal element. The variable resistance layer is arranged between the first electrode and the second electrode. A resistance change is reversibly possible in the variable resistance layer according to move the metal element in and out. The dielectric layer is inserted between the second electrode and the variable resistance layer and has a diffusion coefficient of the metal element smaller than that of the variable resistance layer.

29 Claims, 14 Drawing Sheets

(56) References Cited

U.S. PATENT DOCUMENTS

2011/0108829 A1 5/2011 Banno
2012/0074374 A1 3/2012 Jo
2012/0241709 A1 9/2012 Tsuji

OTHER PUBLICATIONS

International Search Report issued on Feb. 14, 2012 in PCT/JP2011/076598 filed on Nov. 11, 2011.

Sung Hyun Jo et al. "CMOS Compatible Nanoscale Nonvolatile Resistance Switching Memory". American Chemical Society. Nano Letters, vol. 8, No. 2, Jan. 2008, pp. 392-397.

Kim, Kuk-Hwan, et al. "Nanoscale resistive memory with intrinsic diode characteristics and long endurance". American Institute of Physics. Applied Physics Letters, vol. 96 053106, Feb. 2010.

* cited by examiner

NONVOLATILE VARIABLE RESISTANCE ELEMENT

CROSS-REFERENCE TO RELATED APPLICATIONS

This application is a continuation of PCT international application Ser. No. PCT/JP2011/076598 filed on Nov. 11, 2011 which designates the United States and claims the benefit of priority from Japanese Patent Application No. 2011-032875 filed on Feb. 18, 2011; the entire contents of which are incorporated herein by reference.

FIELD

Embodiments described herein relate generally to a nonvolatile variable resistance element.

BACKGROUND

In recent years, the development of a two-terminal nonvolatile variable resistance element represented by a ReRAM (Resistive Random Access Memory) is actively performed. In the nonvolatile variable resistance element, a low-voltage operation, high-speed switching, and scaling down are possible. Therefore, the nonvolatile variable resistance element is prospective as a next-generation large capacity storage device that replaces an existing product such as a floating gate type NAND flash memory. Specifically, examples of the nonvolatile variable resistance element include a nonvolatile variable resistance element in which amorphous silicon is used as a variable resistance layer.

DETAILED DESCRIPTION

In general, according to one embodiment, a nonvolatile variable resistance element includes a first electrode, a second electrode, a variable resistance layer, and a dielectric layer. The second electrode includes a metal element. The variable resistance layer is arranged between the first electrode and the second electrode. A resistance change is reversibly possible in the variable resistance layer according to move the metal element in and out. The dielectric layer is inserted between the second electrode and the variable resistance layer and has a diffusion coefficient of the metal element smaller than that of the variable resistance layer.

Exemplary embodiments of the nonvolatile variable resistance element will be explained below in detail with reference to the accompanying drawings. The present invention is not limited to the following embodiments.

First Embodiment

Figure 1:
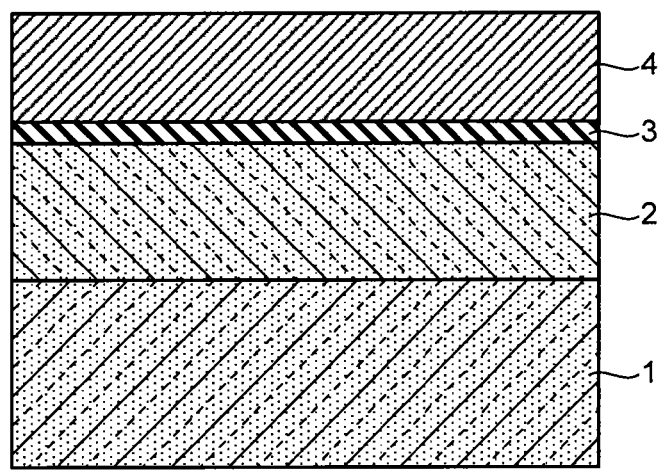
FIG. 1 is a sectional view of a schematic configuration of a nonvolatile variable resistance element according to a first embodiment.

FIG. 1 is a sectional view of a schematic configuration of a nonvolatile variable resistance element according to a first embodiment.

In FIG. 1, in this nonvolatile variable resistance element, a variable resistance layer 2 is laminated on a first electrode 1. A second electrode 4 is laminated on the variable resistance layer 2 via a dielectric layer 3.

The variable resistance layer 2 includes semiconductor elements. The semiconductor elements can be selected out of, for example, Si, Ge, SiGe, GaAs, InP, GaP, GaInAsP, GaN, and SiC. The variable resistance layer 2 can be an amorphous semiconductor, can be a polycrystalline semiconductor, or can be a monocrystalline semiconductor. For example, polycrystal silicon, amorphous silicon, or monocrystal silicon can be used. N or O can be added to the semiconductor element. For example, the semiconductor element can be SiN or $SiO_2$. The film thickness of the variable resistance layer 2 is typically 1 nanometer to 300 nanometers. If microminiaturization of elements is taken into account, the film thickness is desirably smaller. However, if the film thickness is too small, a uniform film is not formed. Therefore, the film thickness is more desirably 2 nanometers to 50 nanometers.

When the semiconductor element of the variable resistance layer 2 is Si, impurity-doped silicon can be used as the first electrode 1. For example, high-density B, As, or P ions can be injected into silicon such that the resistivity of the first electrode 1 is equal to or smaller than 0.005 Ωcm.

The second electrode 4 includes metal elements. As the metal elements, for example, Ag can be used. As the first electrode 1 and the second electrode 4, a conductive material other than Ag can be used. For example, as the first electrode 1 and the second electrode 4, Ag, Au, Ti, Ni, Co, Al, Fe, Cr, Cu, Hf, Pt, Ru, Zr, Bi or Ir, a nitride or a carbide of the metal, a chalcogenide material, or the like can be used. Further, an alloy material containing a plurality of metals or semiconductor elements among such metals or semiconductor elements can be used as the first electrode 1 and the second electrode 4. The first electrode 1 and the second electrode 4 can include the same metal. However, the first electrode 1 is desirably formed of a material that is less easily ionized than the second electrode 4.

The dielectric layer 3 has a smaller diffusion coefficient of the metal elements included in the second electrode 4 than in the variable resistance layer 2. The dielectric layer 3 can be selected out of, for example, a silicon oxide film, a silicon nitride film, an oxynitride, and a carbide. The material and the film thickness of the dielectric layer 3 are desirably set such that ions of the metal elements included in the second electrode 4 can pass through the dielectric layer 3. In other words, if the dielectric layer 3 is uniformly present between the variable resistance layer 2 and the second electrode 4, the film thickness of the dielectric layer 3 is desirably smaller. The film thickness of the dielectric layer 3 can be set to 5 nanometers or less. The dielectric constant of the dielectric layer 3 is desirably smaller than that of the variable resistance layer 2.

This nonvolatile variable resistance element changes from a high resistance state to a low resistance state when a conductive filament, which is formed of the metal elements supplied from the second electrode 4, is formed in the variable resistance layer 2. The nonvolatile variable resistance element changes from the low resistance state to the high resistance state when metal elements of the conductive filament formed in the variable resistance layer 2 are collected in the second electrode 4 and the conductive filament formed in the variable resistance layer 2 are reduced in size.

In the variable resistance layer 2, a resistance change is reversibly possible according to supply and collection of the metal elements included in the second electrode 4. When the nonvolatile variable resistance element changes from the high resistance state to the low resistance state, the metal elements of the second electrode 4 are ionized to enter the variable resistance layer 2. The ionized metal elements combine with electrons, whereby the conductive filament is formed in the variable resistance layer 2. When the nonvolatile variable resistance element changes from the low resistance state to the high resistance state, holes are supplied to the variable resistance layer 2 via the first electrode 1, whereby the metal elements of the conductive filament are ionized. The ionized metal elements are collected in the second electrode 4, whereby the conductive filament in the variable resistance layer 2 is extinguished.

The dielectric layer 3 is provided between the variable resistance layer 2 and the second electrode 4. This makes it possible to suppress the metal elements of the second electrode 4 from diffusing to the variable resistance layer 2. Therefore, even when the conductive filament in the variable resistance layer 2 is extinguished, it is possible to prevent the metal elements of the second electrode 4 from remaining oozing out into the variable resistance layer 2 and suppress deterioration in insulation properties of the variable resistance layer 2. Therefore, it is possible to realize a reduction in the film thickness of the variable resistance layer 2 and reduce a driving current of the nonvolatile variable resistance element. It is possible to microminiaturize the nonvolatile variable resistance element and realize an increase in the capacity of a memory. Further, it is possible to improve an ON/OFF ratio of an electric current flowing to the nonvolatile variable resistance element and improve reliability.

It is desirable that an electric current more easily flows to the dielectric layer 3 than to the variable resistance layer 2. This is because, if the dielectric layer 3 has better insulation properties and higher resistance than the variable resistance layer 2, a switching action in the variable resistance layer 2 does not occur. By setting the film thickness and the dielectric constant of the dielectric layer 3 smaller than those of the variable resistance layer 2, it is possible to allow an electric current to more easily flow to the dielectric layer 3 than to the variable resistance layer 2.

Figure 2A:
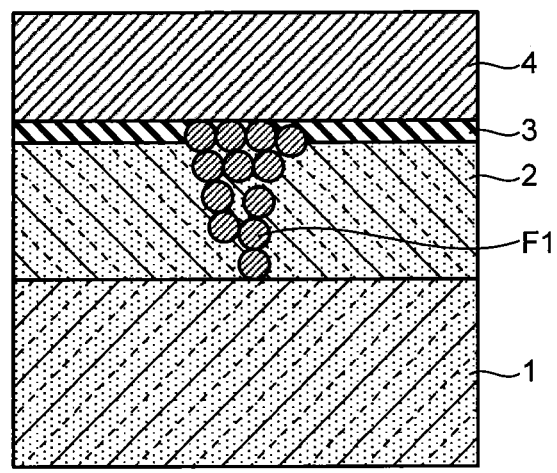
FIG. 2A is a sectional view of a low resistance state of the nonvolatile variable resistance element shown in FIG. 1
Figure 2B:
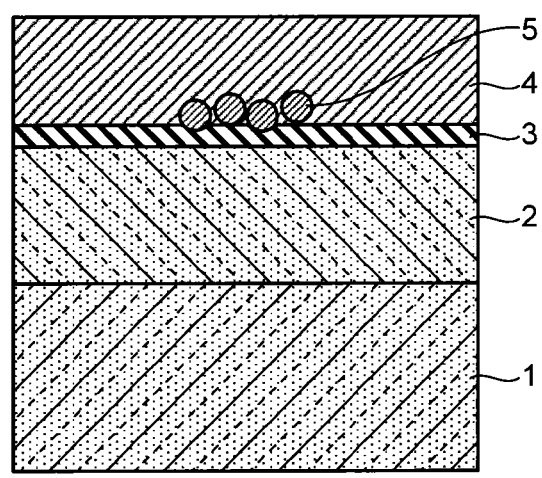
FIG. 2B is a sectional view of a high resistance state of the nonvolatile variable resistance element shown in FIG. 1.

FIG. 2A is a sectional view of the low resistance state of the nonvolatile variable resistance element shown in FIG. 1. FIG. 2B is a sectional view of the high resistance state of the nonvolatile variable resistance element shown in FIG. 1.

In FIG. 2A, in a generation process for a conductive filament F1, the potential of the second electrode 4 is set to be higher than the potential of the first electrode 1 to apply a set voltage to the second electrode 4.

When the set voltage is applied to the second electrode 4, the metal elements of the second electrode 4 are ionized. The ionized metal elements enter the variable resistance layer 2 via the dielectric layer 3 and electrons are supplied to the variable resistance layer 2 via the first electrode 1. In the variable resistance layer 2, the ionized metal elements and the electrons combine, whereby the conductive filament F1 formed of the metal elements included in the second electrode 4 grows into the variable resistance layer 2.

The conductive filament F1 formed of the metal elements of the second electrode 4 grows into the variable resistance layer 2 and the first electrode 1 and the second electrode 4 are short-circuited by the conductive filament F1, whereby the nonvolatile variable resistance element is set in the low resistance state.

On the other hand, as shown in FIG. 2B, in an extinction process for the conductive filament F1, the potential of the second electrode 4 is set to be lower than the potential of the first electrode 1 to apply a reset voltage to the second electrode 4.

When the reset voltage is applied to the second electrode 4, holes are supplied to the variable resistance layer 2 via the first electrode 1, whereby metal elements 5 of the conductive filament F1 are ionized in the variable resistance layer 2. The metal elements 5 of the conductive filament F1 are collected in the second electrode 4 via the dielectric layer 3 and the conductive filament F1 is extinguished in the variable resistance layer 2, whereby the nonvolatile variable resistance element is reset to the high resistance state.

Reversible control of the low resistance state and the high resistance state can be performed according to the polarity of voltage application. At this point, the high resistance state can be associated with an OFF state and the low resistance state can be associated with an ON state. A current value flowing to the nonvolatile variable resistance element when a certain voltage is applied is read to distinguish the ON state and the OFF state. This makes it possible to cause the nonvolatile variable resistance element to operate as a memory. Because transition of the high resistance state and the low resistance state occurs only during voltage application, it is possible to realize a nonvolatile memory.

Figure 3:
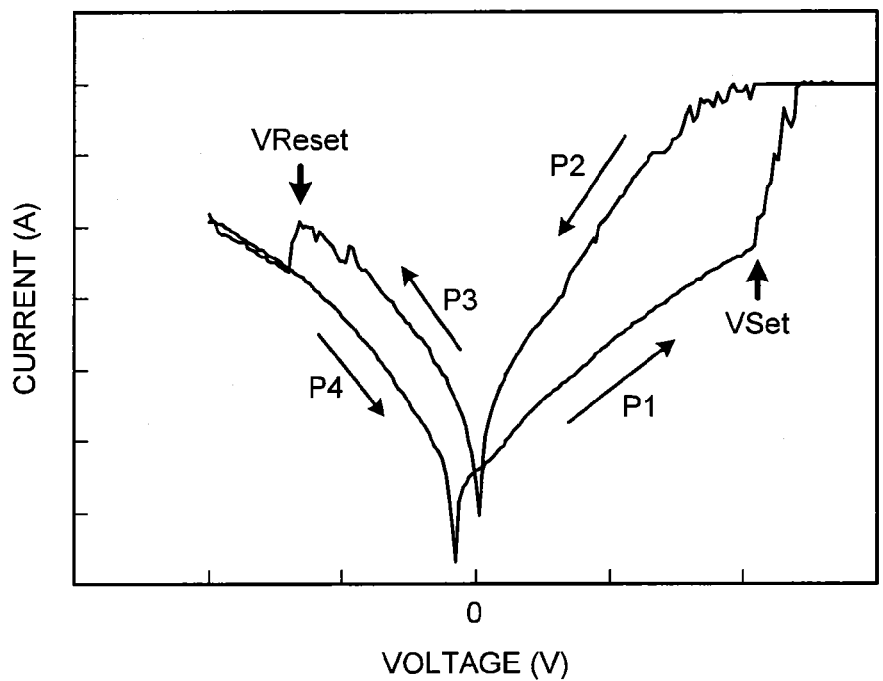
FIG. 3 is a graph of a switching characteristic of the nonvolatile variable resistance element shown in FIG. 1.

FIG. 3 is a graph of a switching characteristic of the nonvolatile variable resistance element shown in FIG. 1.

In FIG. 3, when a voltage applied to the second electrode 4 of the nonvolatile variable resistance element is increased in the positive direction (P1), an electric current suddenly increases at a set voltage Vset (near 4 volts) and the nonvolatile variable resistance element transitions from the high resistance state to the low resistance state.

In the low resistance state, in a range in which the voltage applied to the second electrode 4 is smaller than the set voltage Vset to some extent, the electric current flows generally in proportion to the voltage (P2).

On the other hand, when the voltage applied to the second electrode 4 is swept in the negative direction with respect to the nonvolatile variable resistance element in the low resistance state, the electric current suddenly decreases at a reset voltage Vreset (near −2.5 volts) and the nonvolatile variable resistance element transitions from the low resistance state to the high resistance state (P3).

In the high resistance state, in a range in which the voltage applied to the second electrode 4 is larger than the reset voltage Vreset to some extent, the electric current hardly flows with respect to the voltage (P4).

When the voltage applied to the second electrode 4 is further swept in the positive direction from this state (P1), the electric current suddenly increases at the set voltage Vset and the nonvolatile variable resistance element transitions from the high resistance state to the low resistance state. In other words, the nonvolatile variable resistance element reversibly transitions between the high resistance state and the low resistance state and can store data for one bit.

Figure 4:
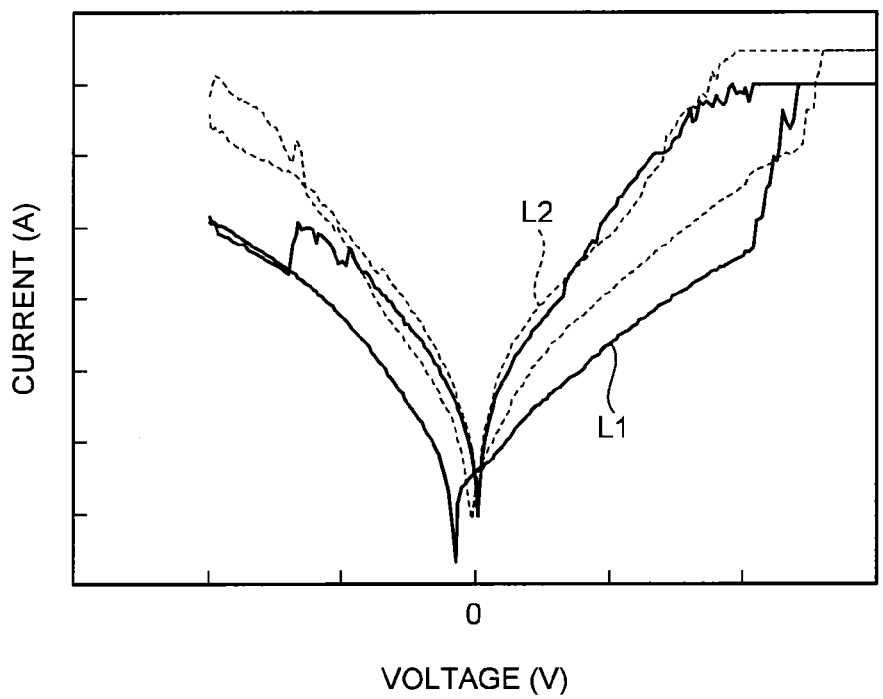
FIG. 4 is a graph of the switching characteristic of the nonvolatile variable resistance element shown in FIG. 1 compared with a switching characteristic of a nonvolatile variable resistance element not including a dielectric layer.

FIG. 4 is a graph of the switching characteristic of the nonvolatile variable resistance element shown in FIG. 1 compared with a switching characteristic of a nonvolatile variable resistance element not including a dielectric layer. L1 indicates a switching characteristic obtained when the dielectric layer 3 is present. L2 indicates a switching characteristic obtained when the dielectric layer 3 is absent.

In FIG. 4, between the absence and the presence of the dielectric layer 3, a difference in a voltage at which the transition from the high resistance state to the low resistance state occurs when a positive voltage is applied to the second electrode 4, i.e., a so-called set voltage Vset is a difference equal to or smaller than 1 volt. The voltage does not substantially vary.

However, the magnitude of an OFF current, which is an electric current flowing during the high resistance state, is smaller by one digit when the dielectric layer 3 is present compared with the magnitude of the OFF current flowing when the dielectric layer 3 is absent. On the other hand, the magnitude of an ON current, which is an electric current flowing during the low resistance state is about the same as the magnitude of the ON current flowing when the dielectric layer 3 is absent. In other words, it is seen that an effect of reducing the OFF current is improved by inserting the dielectric layer 3.

Second Embodiment

A method of manufacturing a nonvolatile variable resistance element according to a second embodiment is explained. In an example explained in the second embodiment, p-type Si, amorphous silicon, a silicon oxide film, and silver Ag are respectively used as the first electrode 1, the variable resistance layer 2, the dielectric layer 3, and the second electrode 4 shown in FIG. 1.

For example, a p-type Si region formed by injecting B ions into a silicon monocrystal substrate under conditions that an acceleration voltage is 30 keV and a dosage is $2 \times 10^{15}$ cm$^{-2}$ and thereafter applying activation anneal to the silicon monocrystal substrate is formed as the first electrode 1.

Subsequently, an amorphous silicon layer is deposited as the variable resistance layer 2 by, for example, the chemical vapor deposition (CVD). In this embodiment, the LP-CVD (Low Pressure Chemical Vapor Deposition) is used.

After a natural oxide film is removed by fluoric acid treatment of the surface of the amorphous silicon layer, SH treatment (cleaning by mixed liquid of sulfuric acid: hydrogen peroxide solution=2:1) is performed to form a chemical oxide film ($SiO_x$) of about 2 nanometer as the dielectric layer 3.

An Ag layer is vapor-deposited on the dielectric layer 3 as the second electrode 4. This makes it possible to manufacture the nonvolatile variable resistance element shown in FIG. 1.

Third Embodiment

Figure 5:
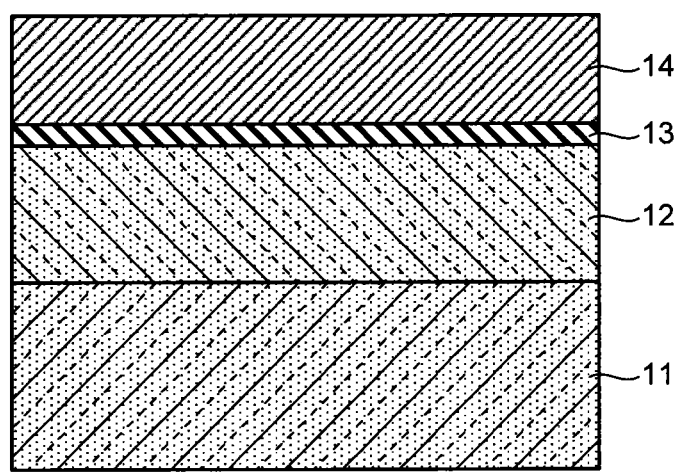
FIG. 5 is a sectional view of a schematic configuration of a nonvolatile variable resistance element according to a third embodiment.

FIG. 5 is a sectional view of a schematic configuration of a nonvolatile variable resistance element according to a third embodiment.

In FIG. 5, in this nonvolatile variable resistance element, a variable resistance layer 12 is laminated on a first electrode 11. A second electrode 14 is laminated on the variable resistance layer 12 via a hydroxide layer 13.

The first electrode 11, the variable resistance layer 12, and the second electrode 14 are the same as the first electrode 1, the variable resistance layer 2, and the second electrode 4 shown in FIG. 1.

The hydroxide layer 13 includes a hydroxide of metal elements of the second electrode 14. The hydroxide layer 13 can be selected out of, for example, AgOH, $Mg(OH)_2$, $Fe(OH)_2$, $Zn(OH)_2$, $Al(OH)_3$, and $Cu(OH)_2$ according to the metal elements of the second electrode 14.

The nonvolatile variable resistance element changes from a high resistance state to a low resistance state when a conductive filament, which is formed of the metal elements supplied from the second electrode 14, is formed in the variable resistance layer 12. The nonvolatile variable resistance element changes from the low resistance state to the high resistance state when metal elements of the conductive filament formed in the variable resistance layer 12 are collected in the second electrode 14 and the conductive filament formed in the variable resistance layer 12 is reduced in size.

In the variable resistance layer 12, a resistance change is reversibly possible according to supply and collection of the metal elements included in the second electrode 14. At this point, the metal elements of the second electrode 14 are ionized to enter the variable resistance layer 12. The ionized metal elements combine with electrons, whereby the conductive filament is formed in the variable resistance layer 12. Holes are supplied to the variable resistance layer 12 via the first electrode 11, whereby the metal elements of the conductive filament are ionized. The ionized metal elements are collected in the second electrode 14, whereby the conductive filament in the variable resistance layer 12 is extinguished.

The hydroxide layer 13 is provided between the variable resistance layer 12 and the second electrode 14. This makes it possible to promote ionization of the metal elements of the second electrode 14 on an interface with the hydroxide layer 13. It is possible to reduce a voltage necessary for changing the resistance of the variable resistance layer 12 and reduce a working current.

Figure 6A:
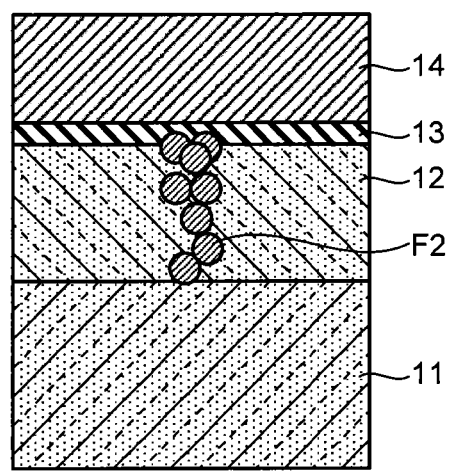
FIG. 6A is a sectional view of a low resistance state of the nonvolatile variable resistance element shown in FIG. 5
Figure 6B:
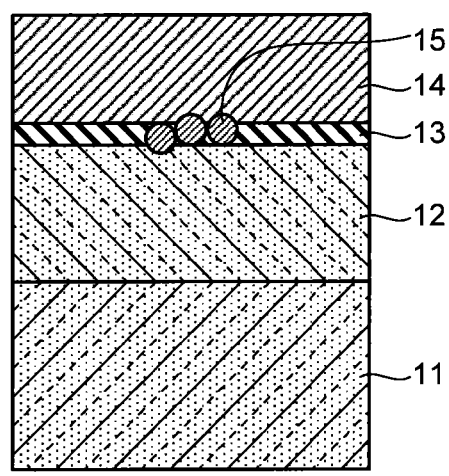
FIG. 6B is a sectional view of a high resistance state of the nonvolatile variable resistance element shown in FIG. 5.

FIG. 6A is a sectional view of the low resistance state of the nonvolatile variable resistance element shown in FIG. 5. FIG. 6B is a sectional view of the high resistance state of the nonvolatile variable resistance element shown in FIG. 5.

In FIG. 6A, in a generation process for a conductive filament F2, the potential of the second electrode 14 is set to be higher than the potential of the first electrode 11 to apply a set voltage to the second electrode 14.

On the interface of the hydroxide layer 13, an OH radical of the hydroxide layer 13 acts on the metal elements of the second electrode 14, whereby the ionization of the metal elements of the second electrode 14 is promoted. The ionized metal elements enter the variable resistance layer 12 and electrons are supplied to the variable resistance layer 12 via the first electrode 11. In the variable resistance layer 12, the ionized metal elements and the electrons combine, whereby the conductive filament F2 formed of the metal elements of the second electrode 14 grows into the variable resistance layer 12.

The conductive filament F2 formed of the metal elements of the second electrode 14 grows into the variable resistance layer 12 and the first electrode 11 and the second electrode 14 are short-circuited by the conductive filament F2, whereby the nonvolatile variable resistance element is set in the low resistance state.

On the other hand, as shown in FIG. 6B, in an extinction process for the conductive filament F2, the potential of the second electrode 14 is set to be lower than the potential of the first electrode 11 to apply a reset voltage to the second electrode 14.

Holes are supplied to the variable resistance layer 12 via the first electrode 11, whereby metal elements 15 of the conductive filament F2 are ionized in the variable resistance layer 12. At this point, the OH radical of the hydroxide layer 13 is moved to the variable resistance layer 12 by an electric field and acts on the metal elements 15 of the conductive filament F2, whereby the ionization of the metal elements 15 of the conductive filament F2 is promoted. The metal elements 15 of the conductive filament F2 are collected in the second electrode 14 and the conductive filament F2 is extinguished in the variable resistance layer 12, whereby the nonvolatile variable resistance element is reset to the high resistance state.

Figure 7A:
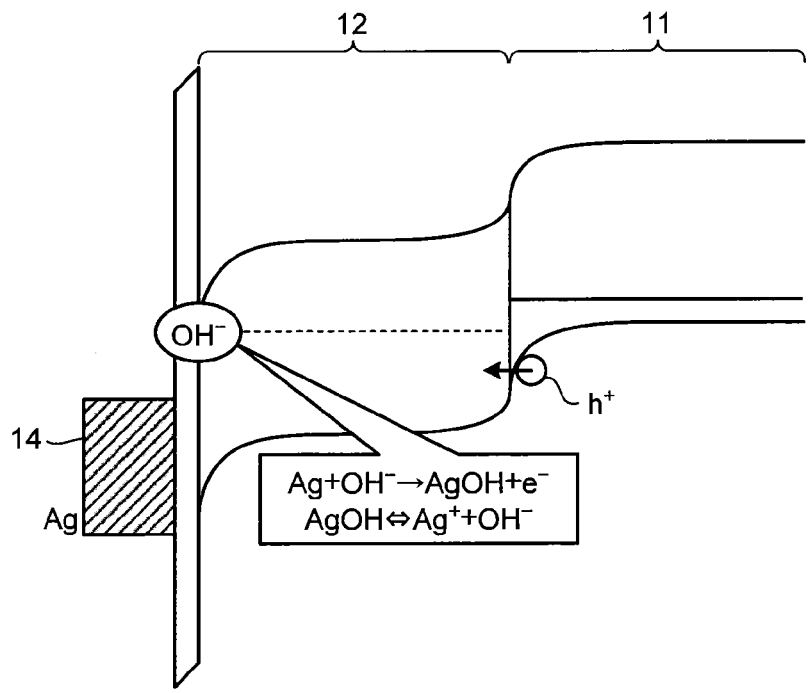
FIGS. 7A and 7B are energy band charts of a generation process for a conductive filament of the nonvolatile variable resistance element shown in FIG. 5.
Figure 7B:
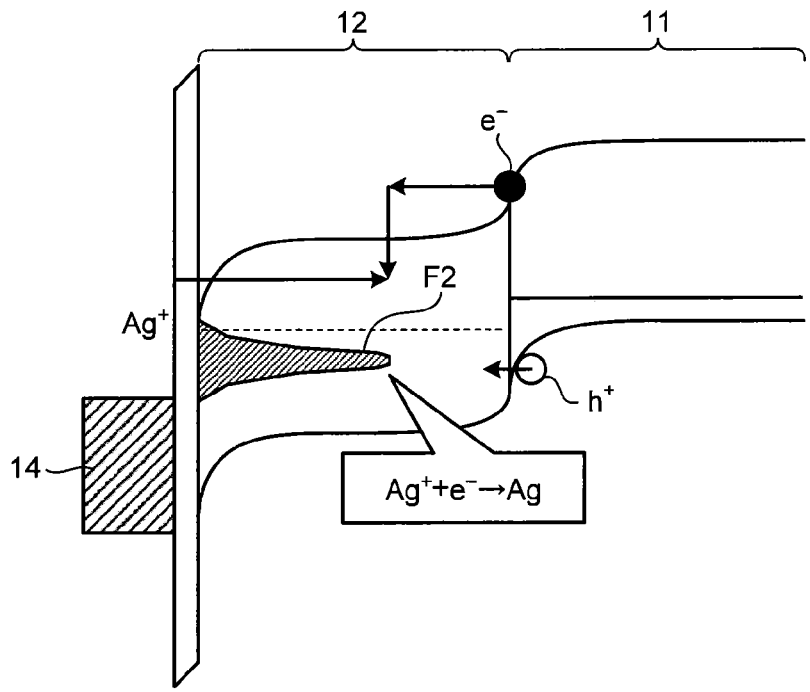

FIGS. 7A and 7B are energy band charts of a generation process for the conductive filament of the nonvolatile variable resistance element shown in FIG. 5. In an example shown in FIGS. 7A and 7B, p-type Si, amorphous silicon, an AgOH film, and silver Ag are respectively used as the first electrode 11, the variable resistance layer 12, the hydroxide layer 13, and the second electrode 14 shown in FIG. 5.

In FIG. 7A, the OH radical of the hydroxide layer 13 acts on silver Ag of the second electrode 14, whereby a reaction described below occurs and silver Ag of the second electrode 14 is hydrogenated.

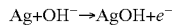

Because a hydroxide of silver Ag is unstable, a reaction described below occurs, whereby silver Ag is ionized and supplied to the variable resistance layer 12.

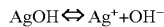

As shown in FIG. 7B, an electron $e^-$ is supplied to the variable resistance layer 12 via the first electrode 11 and a silver ion $Ag^+$ and the electron $e^-$ combine, whereby the conductive filament F2 formed of silver Ag grows in the variable resistance layer 12.

In this way, when the hydroxide of the electrode metal is present, metal ions are generated by the reaction of the hydroxide and the ionization of the electrode metal is promoted. This reaction is not a reaction peculiar to silver Ag and could occur in other metals such as copper Cu.

Fourth Embodiment

A method of manufacturing a nonvolatile variable resistance element according to a fourth embodiment is explained. In an example explained in the fourth embodiment, p-type Si, amorphous silicon, an AgOH film, and silver Ag are respectively used as the first electrode 11, the variable resistance layer 12, the hydroxide layer 13, and the second electrode 14 shown in FIG. 5.

For example, a p-type Si region formed by injecting B ions into a silicon monocrystal substrate under conditions that an acceleration voltage is 30 keV and a dosage is $2\times10^{15}$ $cm^{-2}$ and thereafter applying activation anneal to the silicon monocrystal substrate is formed as the first electrode 11.

Subsequently, an amorphous silicon layer is deposited as the variable resistance layer 12 by, for example, the chemical vapor deposition (CVD).

After a natural oxide film is removed by fluoric acid treatment of the surface of the amorphous silicon layer, SH treatment is performed to OH-terminate the surface of the amorphous silicon layer.

An Ag layer is vapor-deposited as the second electrode 14 and an OH radical on the surface of the amorphous silicon layer and Ag of the second electrode 14 are caused to react, whereby the hydroxide layer 13 is inserted between the second electrode 14 and the variable resistance layer 12.

In the example explained the embodiments explained above, the electrodes and the layers are laminated in the order of the first electrode 11, the variable resistance layer 12, the hydroxide layer 13, and the second electrode 14. However, the electrodes and the layers can be laminated in the order of the second electrode 14, the hydroxide layer 13, the variable resistance layer 12, and the first electrode 11. In this case, when an Ag layer is used as the second electrode 14, it is possible to form AgOH on the surface of the Ag layer by performing SH treatment of the Ag layer.

However, when AgOH on the surface of the Ag layer is put in an environment in which AgOH is unstable and is immediately decomposed, to allow AgOH to be easily formed, the SH treatment can be performed after a layer including the OH radical is formed on the Ag layer.

For example, it is possible to, after forming the Ag layer, laminate an amorphous silicon layer of about 1 nanometer or less, OH-terminate the surface of the amorphous silicon layer through the SH treatment of the amorphous silicon layer, and form the variable resistance layer 12 on the surface of the amorphous silicon layer. At this point, it is possible to insert the hydroxide layer 13 between the second electrode 14 and the variable resistance layer 12 by causing the OH radical on the surface of the amorphous silicon layer and Ag of the second electrode 14 to react.

Fifth Embodiment

Figure 8:
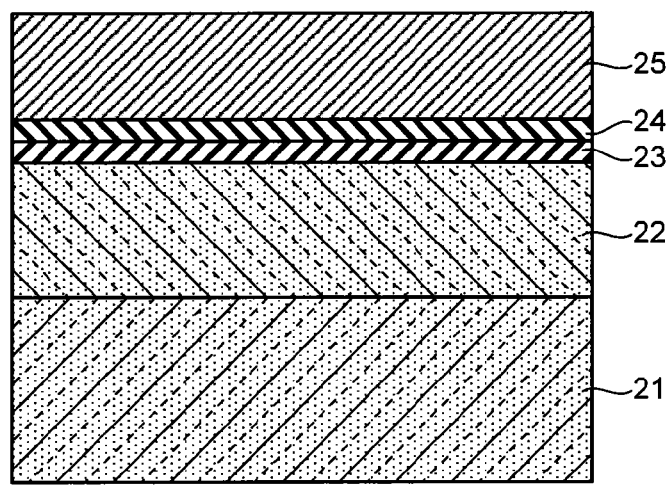
FIG. 8 is a sectional view of a schematic configuration of a nonvolatile variable resistance element according to a fifth embodiment.

FIG. 8 is a sectional view of a schematic configuration of a nonvolatile variable resistance element according to a fifth embodiment.

In FIG. 8, in this nonvolatile variable resistance element, a variable resistance layer 22 is laminated on a first electrode 21. A second electrode 25 is laminated on the variable resistance layer 22 sequentially via a dielectric layer 23 and a hydroxide layer 24.

The first electrode 21, the variable resistance layer 22, the dielectric layer 23, and the second electrode 24 are the same as the first electrode 1, the variable resistance layer 2, the dielectric layer 3, and the second electrode 4 shown in FIG. 1. The hydroxide layer 24 is the same as the hydroxide layer 13 shown in FIG. 5.

The nonvolatile variable resistance element changes from a high resistance state to a low resistance state when a conductive filament, which is formed of the metal elements supplied from the second electrode 25, is formed in the variable resistance layer 22. The nonvolatile variable resistance element changes from the low resistance state to the high resistance state when metal elements of the conductive filament formed in the variable resistance layer 22 are collected in the second electrode 25 and the conductive filament formed in the variable resistance layer 22 is reduced in size.

In the variable resistance layer 22, a resistance change is reversibly possible according to supply and collection of the metal elements included in the second electrode 25. At this point, the metal elements of the second electrode 25 are ionized to enter the variable resistance layer 22. The ionized metal elements combine with electrons, whereby the conductive filament is formed in the variable resistance layer 22. Holes are supplied to the variable resistance layer 22 via the first electrode 21, whereby metal elements of the conductive filament are ionized. The ionized metal elements are collected in the second electrode 25, whereby the conductive filament in the variable resistance layer 22 is extinguished.

The dielectric layer 23 and the hydroxide layer 24 are provided between the variable resistance layer 22 and the second electrode 25. This makes it possible to suppress the metal elements of the second electrode 25 from diffusing to the variable resistance layer 22 and promote ionization of the metal elements of the second electrode 25 on an interface with the hydroxide layer 24. Therefore, it is possible to suppress deterioration in insulation properties of the variable resistance layer 22. Further, it is possible to improve an ON/OFF ratio of an electric current flowing to the nonvolatile variable resistance element and reduce a voltage and a working current necessary for changing the resistance of the variable resistance layer 22.

Figure 9A:
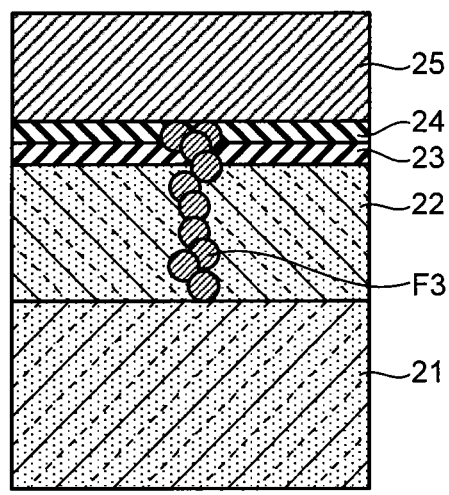
FIG. 9A is a sectional view of a low resistance state of the nonvolatile variable resistance element shown in FIG. 8
Figure 9B:
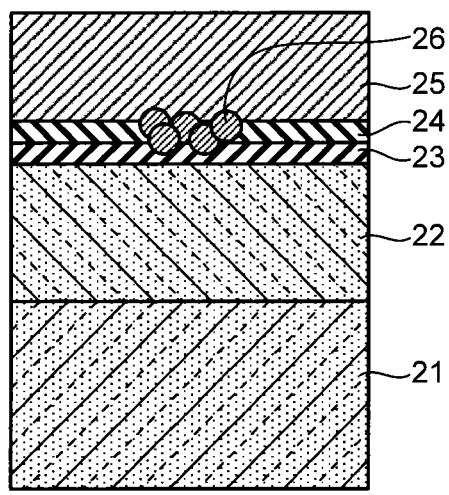
FIG. 9B is a sectional view of a high resistance state of the nonvolatile variable resistance element shown in FIG. 8.

FIG. 9A is a sectional view of the low resistance state of the nonvolatile variable resistance element shown in FIG. 8. FIG. 9B is a sectional view of the high resistance state of the nonvolatile variable resistance element shown in FIG. 8.

In FIG. 9A, in a generation process for a conductive filament F3, the potential of the second electrode 25 is set to be higher than the potential of the first electrode 21 to apply a set voltage to the second electrode 25.

On the interface of the hydroxide layer 24, an OH radical of the hydroxide layer 24 acts on the metal elements of the second electrode 25, whereby the ionization of the metal elements of the second electrode 25 is promoted. The ionized metal elements enter the variable resistance layer 22 via the dielectric layer 23 and electrons are supplied to the variable resistance layer 22 via the first electrode 21. In the variable resistance layer 22, the ionized metal elements and the electrons combine, whereby the conductive filament F3 formed of the metal elements of the second electrode 25 grows into the variable resistance layer 22.

The conductive filament F3 formed of the metal elements of the second electrode 25 grows into the variable resistance layer 22 and the first electrode 21 and the second electrode 25 are short-circuited by the conductive filament F3, whereby the nonvolatile variable resistance element is set in the low resistance state.

On the other hand, as shown in FIG. 9B, in an extinction process for the conductive filament F3, the potential of the second electrode 25 is set to be lower than the potential of the first electrode 21 to apply a reset voltage to the second electrode 25.

Holes are supplied to the variable resistance layer 22 via the first electrode 21, whereby metal elements 26 of the conductive filament F3 are ionized in the variable resistance layer 22. At this point, the OH radical of the hydroxide layer 24 is moved to the variable resistance layer 22 by an electric field and acts on the metal elements 26 of the conductive filament F3, whereby the ionization of the metal elements 26 of the conductive filament F3 is promoted. The metal elements 26 of the conductive filament F3 are collected in the second electrode 25 via the dielectric layer 23 and the conductive filament F3 is extinguished in the variable resistance layer 22, whereby the nonvolatile variable resistance element is reset to the high resistance state.

Sixth Embodiment

Figure 10A:
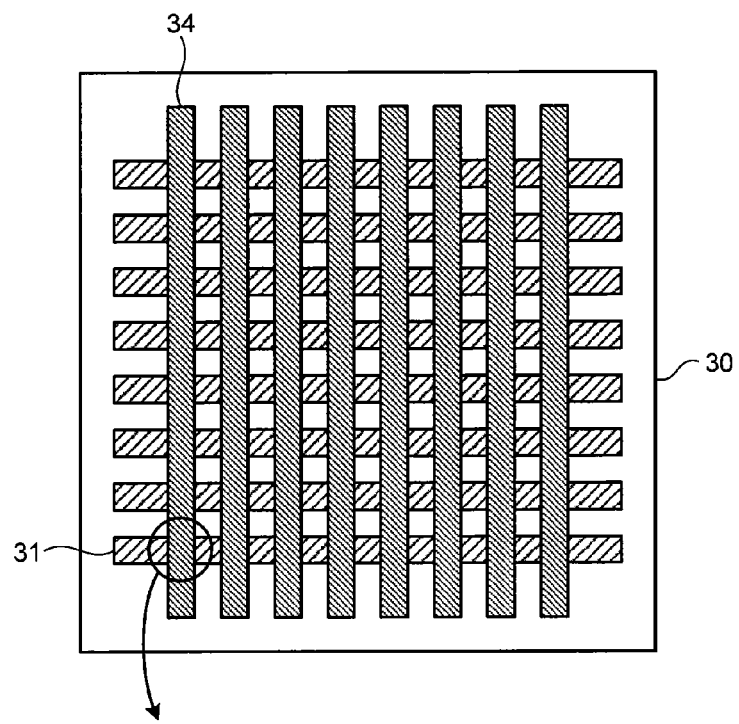
FIG. 10A is a plan view of a schematic configuration of a memory cell array to which a nonvolatile variable resistance element according to a sixth embodiment is applied and FIG. 10B is a sectional view of a schematic configuration of a cross point section of the memory cell array shown in FIG. 10A.
Figure 10B:
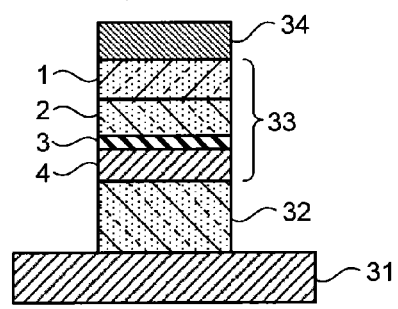

FIG. 10A is a plan view of a schematic configuration of a memory cell array to which a nonvolatile variable resistance element according to a sixth embodiment is applied. FIG. 10B is a sectional view of a schematic configuration of a cross point section of the memory cell array shown in FIG. 10A.

In FIGS. 10A and 10B, in a memory cell array 30, lower wires 31 are formed in a column direction and upper wires 34 are formed in a row direction. A nonvolatile variable resistance element 33 is arranged in a cross point section between the lower wire 31 and the upper wire 34 via a rectifying element 32. As the nonvolatile variable resistance element 33, for example, the nonvolatile variable resistance element shown in FIG. 1, FIG. 5, or FIG. 8 can be used. In an example shown in FIG. 10B, a method of providing the rectifying element 32 on the nonvolatile variable resistance element 33 is explained. However, the rectifying element 32 can be removed.

Figure 11:
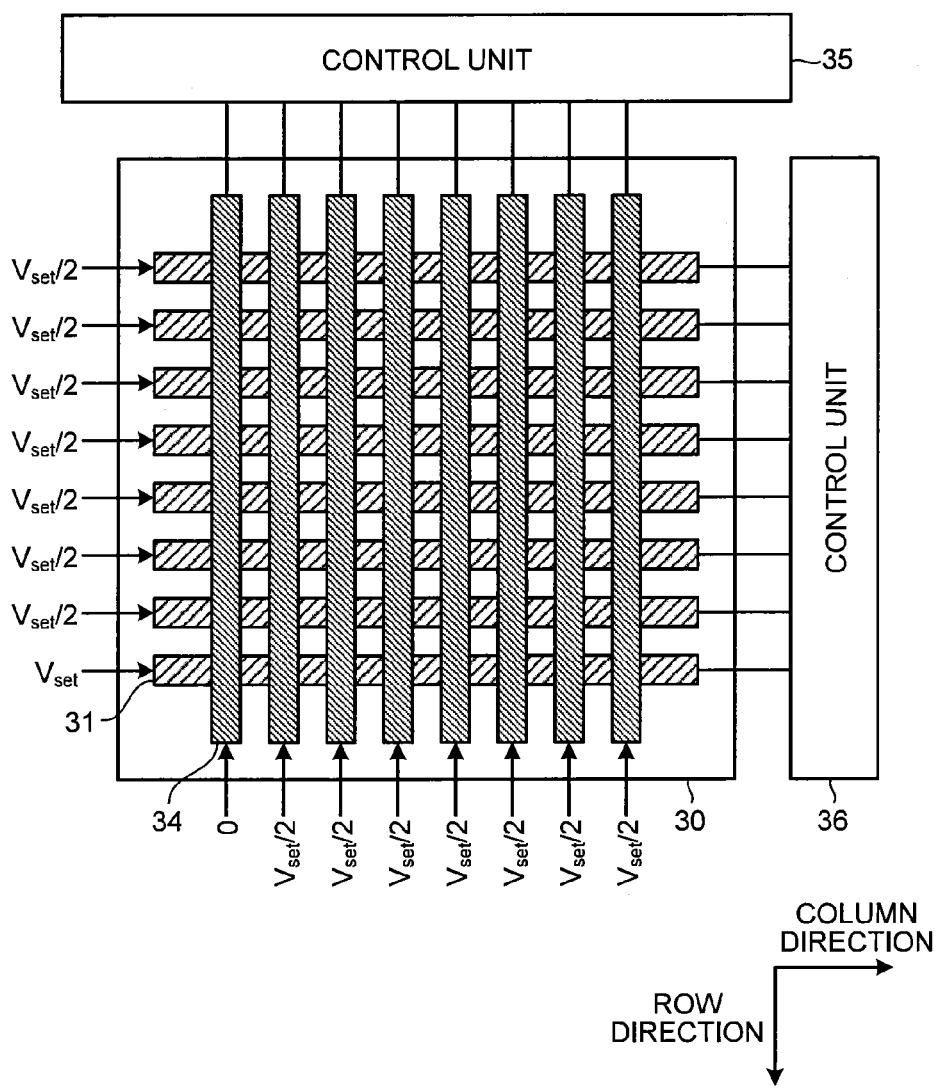
FIG. 11 is a plan view for explaining a voltage setting method during writing in a selected cell in the memory cell array shown in FIG. 10A.

FIG. 11 is a plan view for explaining a voltage setting method during writing in a selected cell in the memory cell array shown in FIG. 10A.

In FIG. 11, around the memory cell array 30, a control unit 35 that performs row selection and a control unit 36 that performs column selection are provided. When writing in a selected cell is performed, the set voltage Vset is applied to the lower wire 31 of a selected column and a half voltage of the set voltage Vset is applied to the lower wires 31 of unselected columns. 0 volt is applied to the upper wire 34 of a selected row and the half voltage of the set voltage Vset is applied to the upper wires 34 of unselected rows.

As a result, the set voltage Vset is applied to the selected cell designated by the selected column and the selected row and writing in the selected cell is performed. The half voltage of the set voltage Vset is applied to half-selected cells designated by the unselected columns and the selected row and writing in the half-selected cells is prohibited. The half voltage of the set voltage Vset is applied to half-selected cell designated by the selected column and the unselected rows and writing in the half-selected cells is prohibited. 0 volt is applied to unselected cells designated by the unselected columns and the unselected rows and writing in the unselected cells is prohibited.

Figure 12:
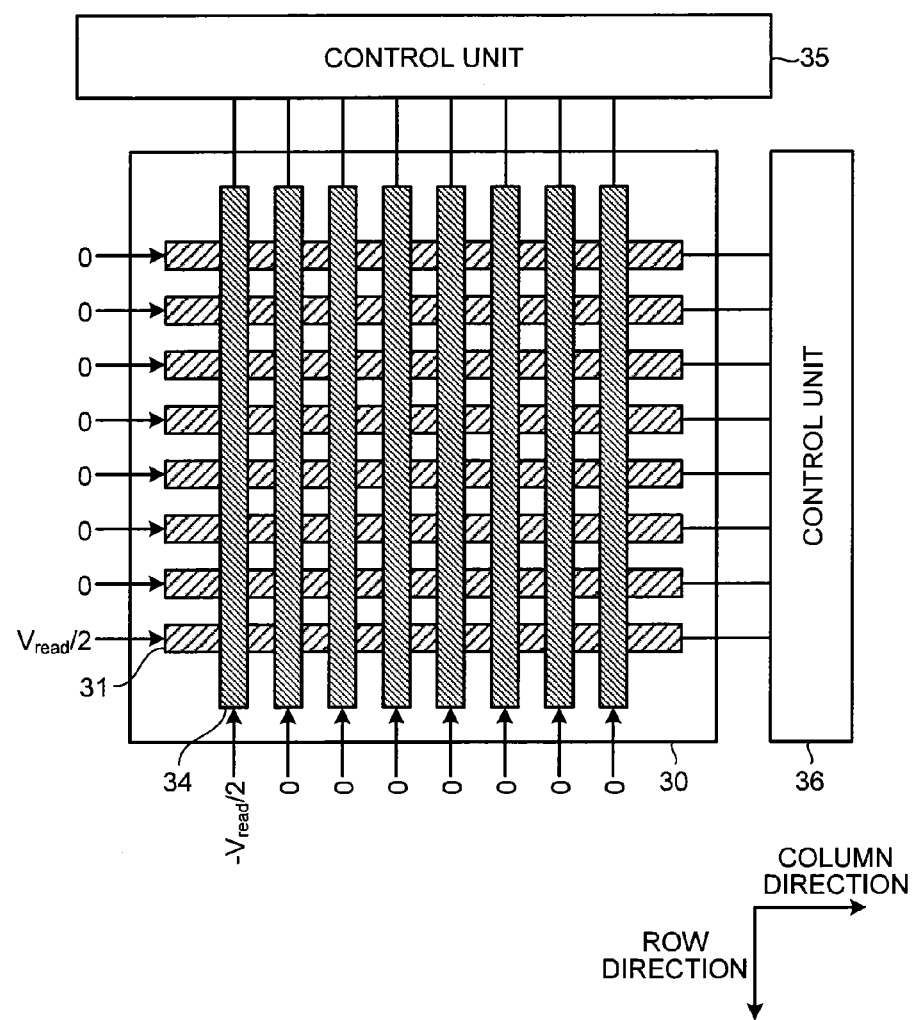
FIG. 12 is a plan view for explaining a voltage setting method during readout from the selected cell in the memory cell array shown in FIG. 10A.

FIG. 12 is a plan view for explaining a voltage setting method during readout from a selected cell in the memory cell array shown in FIG. 10A.

In FIG. 12, when readout from the selected cell is performed, a half voltage of a read voltage Vread is applied to the lower wire 31 of a selected column and 0 volt is applied to the lower wires 31 of unselected columns. A minus half voltage of the read voltage Vread is applied to the upper wire 34 of a selected row and 0 volt is applied to the upper wires 34 of unselected rows.

As a result, the read voltage Vread is applied to the selected cell designated by the selected column and the selected row and readout from the selected cell is performed. On the other hand, the minus half voltage of the read voltage Vread is applied to half-selected cells designated by the unselected columns and the selected row and readout from the half-selected cells is prohibited. The half voltage of the read voltage Vread is applied to half-selected cells designated by the selected column and the unselected rows and readout from the half-selected cells is prohibited. 0 volt is applied to unselected cells designated by the unselected columns and the unselected rows and readout from the unselected cells is prohibited.

Figure 13:
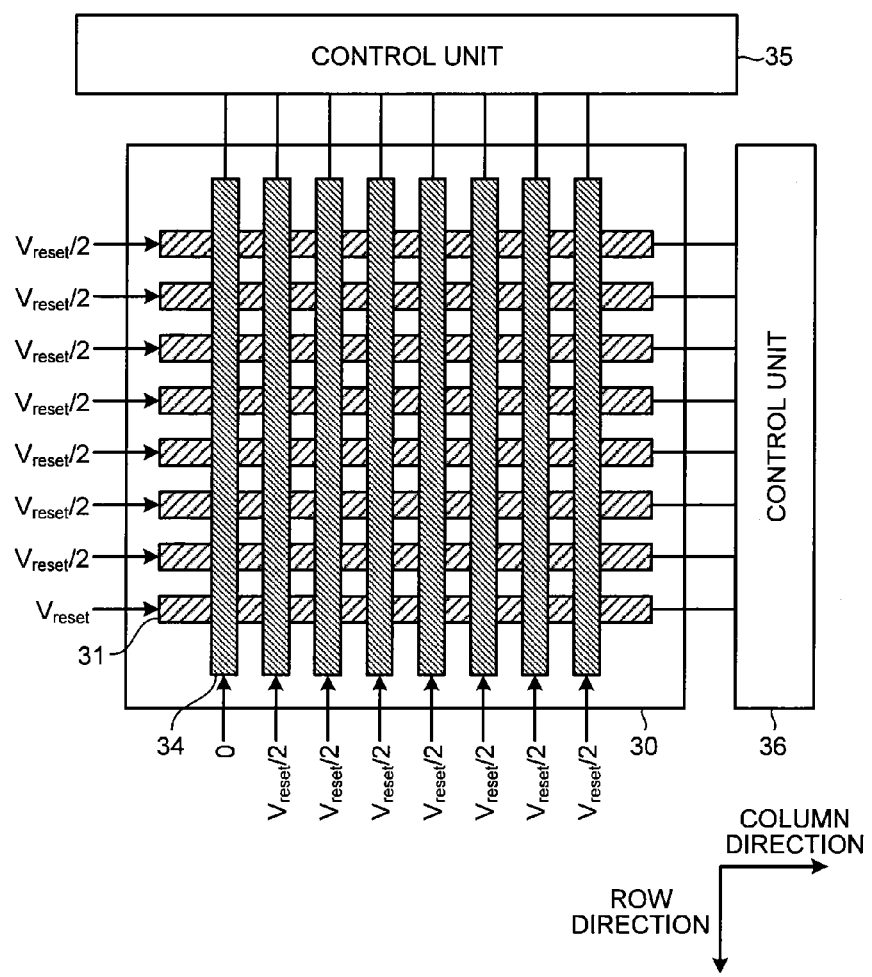
FIG. 13 is a plan view for explaining a voltage setting method during erasing of the selected cell in the memory cell array shown in FIG. 10A.

FIG. 13 is a plan view for explaining a voltage setting method during erasing of a selected cell in the memory cell array shown in FIG. 10A.

In FIG. 13, when erasing of the selected cell is performed, the reset voltage Vreset is applied to the lower wire 31 of a selected column and a half voltage of the reset voltage Vreset is applied to the lower wire 31 of unselected columns. 0 volt is applied to the upper wire 34 of a selected row and the half voltage of the reset voltage Vreset is applied to the upper wires 34 of unselected rows.

As a result, the reset voltage Vreset is applied to the selected cell designated by the selected column and the selected row and erasing of the selected cell is performed. On the other hand, the half voltage of the reset voltage Vreset is applied to half-selected cells designated by the unselected columns and the selected row and erasing of the half-selected cells is prohibited. The half voltage of the reset voltage Vreset is applied to half-selected cells designated by the selected column and the unselected rows and erasing of the half-selected cells is prohibited. 0 volt is applied to unselected cells designated by the unselected columns and the unselected rows and erasing of the unselected cells is prohibited.

Seventh Embodiment

Figure 14:
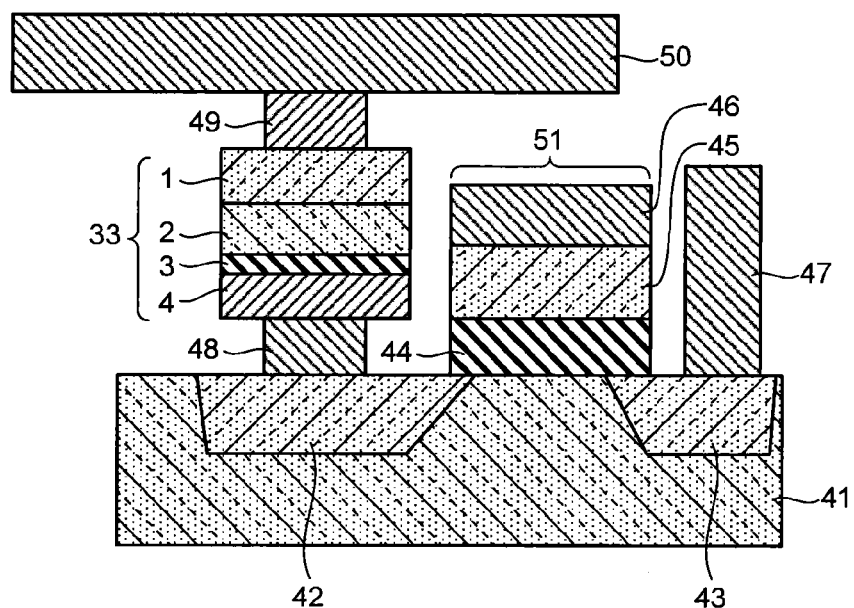
FIG. 14 is a sectional view of a schematic configuration of a nonvolatile variable resistance element according to a seventh embodiment.

FIG. 14 is a sectional view of a schematic configuration of a nonvolatile variable resistance element according to a seventh embodiment.

In FIG. 14, a gate electrode 45 is formed on a semiconductor substrate 41 via a gate insulating film 44. A word line 46 is formed on the gate electrode 45. In the semiconductor substrate 41, impurity diffusion layers 42 and 43 are formed to hold a channel region formed under the gate electrode 45, whereby a transistor 51 is formed. A source line 47 is connected to the impurity diffusion layer 43.

On the semiconductor substrate 41, the nonvolatile variable resistance element 33 is arranged adjacent to the transistor 51. As the nonvolatile variable resistance element 33, for example, a configuration same as that shown in FIG. 1 can be used. The second electrode 4 of the nonvolatile variable resistance element 33 is connected to the impurity diffusion layer 42 via a connection conductor 48. The first electrode 11 of the nonvolatile variable resistance element 33 is connected to a bit line 50 via a connection conductor 49.

The transistor 51 is turned on via the word line 46, whereby the nonvolatile variable resistance element 33 can be accessed and the nonvolatile variable resistance element 33 set as a read and write target can be selected.

In the explanation of an example shown in FIG. 14, the configuration shown in FIG. 1 is used as the nonvolatile variable resistance element 33. However, the configuration shown in FIG. 5 or FIG. 8 can be used.

Figure 15:
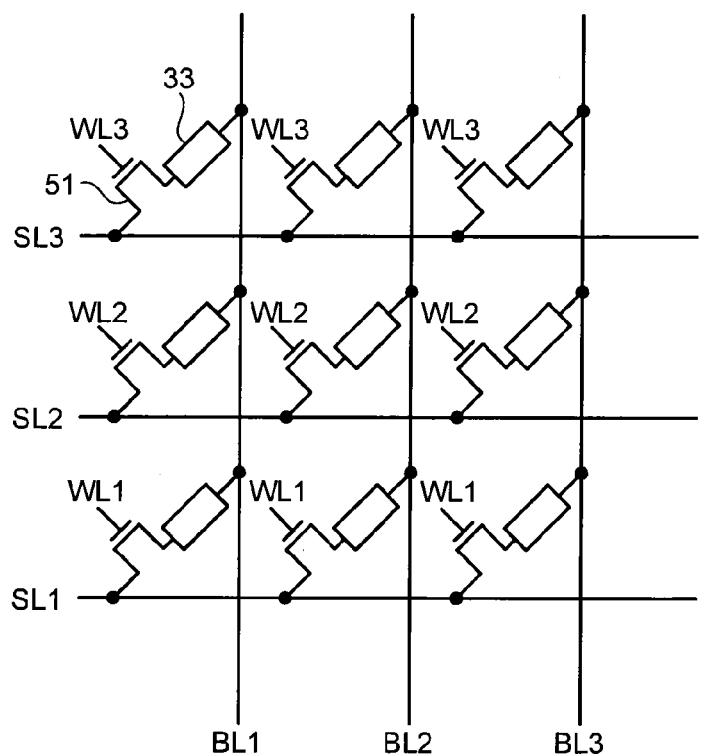
FIG. 15 is a plan view of a schematic configuration of a memory cell array to which the nonvolatile variable resistance element shown in FIG. 14 is applied.

FIG. 15 is a plan view of a schematic configuration of a memory cell array to which the nonvolatile variable resistance element shown in FIG. 14 is applied.

In FIG. 15, on the semiconductor substrate 41 shown in FIG. 14, bit lines BL1 to BL3 are wired in a column direction and word lines WL1 to WL3 are wired in a row direction. In cross point sections of the bit lines BL1 to BL3 and the word lines WL1 to WL3, nonvolatile variable resistance elements 33 and transistors 51 are arranged. The nonvolatile variable resistance elements 33 and the transistors 51 are connected in series to each other.

One ends of the nonvolatile variable resistance elements 33 of the same columns are connected to the same bit lines BL1 to BL3. One ends of the transistors 51 of the same rows are connected to the same source lines SL1 to SL3. Gate electrodes 45 of the transistors 51 of the same rows are connected to the same word lines WL1 to WL3.

The transistors 51 are turned on via the word lines WL1 to WL3, whereby a voltage can be applied between first electrodes 1 and second electrodes 4 of the nonvolatile variable resistance elements 3 of a selected row. Therefore, during readout from the nonvolatile variable resistance elements 33 of the selected row, it is possible to prevent an electric current from flowing to the nonvolatile variable resistance elements 33 of the unselected rows and reduce readout time.

Eight Embodiment

Figure 16:
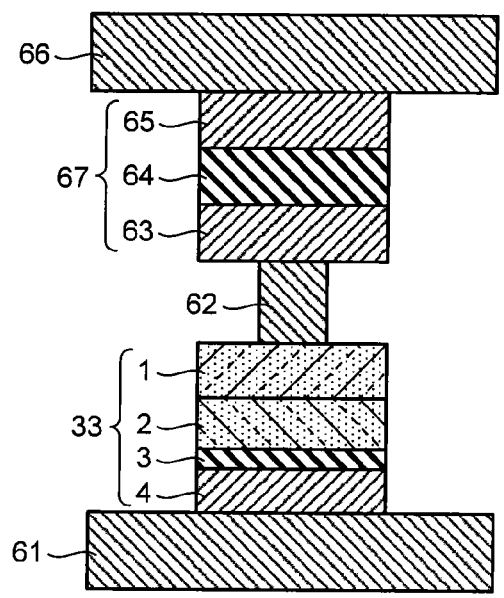
FIG. 16 is a sectional view of a schematic configuration of a nonvolatile variable resistance element according to an eighth embodiment.

FIG. 16 is a sectional view of a schematic configuration of a nonvolatile variable resistance element according to an eighth embodiment.

In FIG. 16, the nonvolatile variable resistance element 33 is arranged on a lower wire 61. A unipolar variable resistance element 67 is arranged on the nonvolatile variable resistance element 33 via a connection conductor 62. An upper wire 66 is arranged on the unipolar variable resistance element 67. In the unipolar variable resistance element 67, a variable resistance layer 64 is laminated on a lower electrode 63 and an upper electrode 65 is laminated on the variable resistance layer 64. As the variable resistance layer 64, a transition metal oxide such as $HfO_2$, $ZrO_2$, NiO, $V_2O_5$, ZnO, $TiO_2$, $Nb_2O_5$, $WO_3$, or CoO can be used. In the unipolar variable resistance element 67, the resistance of the variable resistance layer 64 can be changed by changing the amplitude and the time of pulse stress applied to the variable resistance layer 64.

When forward bias is applied to the unipolar variable resistance element 67, the set voltage Vset is applied to the nonvolatile variable resistance element 33 via the lower wire 61. This makes it possible to form the conductive filament F1 shown in FIG. 2A in the variable resistance layer 2 and reduce the resistance of the nonvolatile variable resistance element 33.

On the other hand, when reverse bias is applied to the unipolar variable resistance element 67, the reset voltage Vreset is applied to the nonvolatile variable resistance element 33 via the lower wire 61. This makes it possible to extinguish the conductive filament F1 shown in FIG. 2A from the variable resistance layer 2 and increase the resistance of the nonvolatile variable resistance element 33.

The nonvolatile variable resistance element 33 is connected to the unipolar variable resistance element 67 in series. This makes it possible to improve an ON/OFF ratio compared with an ON/OFF ratio obtained when a diode is connected to the unipolar variable resistance element 67 in series.

In the explanation of an example shown in FIG. 16, the configuration shown in FIG. 1 is used as the nonvolatile variable resistance element 33. However, the configuration shown in FIG. 5 or FIG. 8 can be used.

Figure 17:
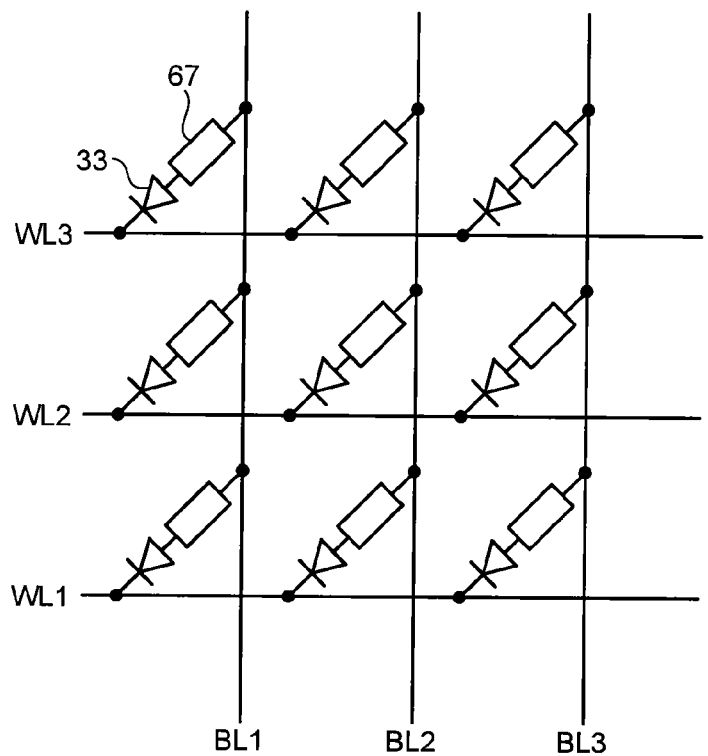
FIG. 17 is a plan view of a schematic configuration of a memory cell array to which the nonvolatile variable resistance element shown in FIG. 16 is applied.

FIG. 17 is a plan view of a schematic configuration of a memory cell array to which the nonvolatile variable resistance element shown in FIG. 16 is applied.

In FIG. 17, the bit lines BL1 to BL3 are wired in a column direction and the word lines WL1 to WL3 are wired in a row direction. In cross point sections of the bit lines BL1 to BL3 and the word lines WL1 to WL3, the nonvolatile variable resistance elements 33 and unipolar variable resistance elements 67 are arranged. The nonvolatile variable resistance elements 33 and the unipolar variable resistance elements 67 are connected in series to each other.

One ends of the unipolar variable resistance elements 67 of the same columns are connected to the same bit lines BL1 to BL3. One ends of the nonvolatile variable resistance elements 33 of the same rows are connected to the same word lines WL1 to WL3.

According to such connection, when reverse bias is applied to unselected cells, the resistance of the variable resistance elements is increased. Therefore, it is possible to reduce current noise flowing from the unselected cells during current readout from a selected cell, improve stability of a readout operation, and reduce a readout time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile variable resistance element comprising:
a first electrode;
a second electrode including a metal element;
a variable resistance layer arranged between the first electrode and the second electrode, a resistance change being reversibly possible in the variable resistance layer according to an in-and-out move of the metal element, the variable resistance layer having a semiconductor element, and the variable resistance layer consisting of material other than amorphous silicon; and
a dielectric layer inserted between the second electrode and the variable resistance layer, the dielectric layer having a diffusion coefficient of the metal element smaller than that of the variable resistance layer, and the dielectric layer having material and a film thickness that allow ions of the metal element included in the second electrode to pass through the dielectric layer without contact between the second electrode and the variable resistance layer.

2. The nonvolatile variable resistance element according to claim 1, wherein the variable resistance layer is polycrystal silicon or monocrystal silicon.

3. The nonvolatile variable resistance element according to claim 1, wherein the dielectric layer is a silicon oxide film, a silicon nitride film, an oxynitride film, or a carbide film.

4. The nonvolatile variable resistance element according to claim 1, wherein the first electrode is impurity-doped silicon.

5. The nonvolatile variable resistance element according to claim 1, wherein the metal element is selected out of Ag, Ti, Ni, Co, Al, Cr, Cu, W, Hf, Ta, Au, Bi and Zr.

6. A nonvolatile variable resistance element comprising:
a first electrode;
a second electrode including a metal element;
a variable resistance layer arranged between the first electrode and the second electrode, a resistance change being reversibly possible in the variable resistance layer according to an in-and-out move of the metal element, the variable resistance layer having a semiconductor element, and the variable resistance layer consisting of material other than amorphous silicon; and
an insulating film inserted between the second electrode and the variable resistance layer, the insulating film selected out of a group including a silicon oxide film, a silicon nitride film, an oxynitride film, and a carbide film, and the insulating film having material and a film thickness that allow ions of the metal element included in the second electrode to pass through the dielectric layer without contact between the second electrode and the variable resistance layer.

7. The nonvolatile variable resistance element according to claim 6, wherein the variable resistance layer is polycrystal silicon or monocrystal silicon.

8. The nonvolatile variable resistance element according to claim 6, wherein the first electrode is impurity-doped silicon.

9. The nonvolatile variable resistance element according to claim 6, wherein the metal element is selected out of Ag, Ti, Ni, Co, Al, Cr, Cu, W, Hf, Ta, Au, Bi and Zr.

10. The nonvolatile variable resistance element according to claim 6, wherein a laminated structure of the first electrode, the variable resistance layer, the dielectric layer, and the second electrode is arranged at a cross point of a word line and a bit line.

11. The nonvolatile variable resistance element according to claim 10, further comprising a rectifying element arranged between the word line and the bit line.

12. The nonvolatile variable resistance element according to claim 6, further comprising a transistor connected to the laminated structure in series.

13. A nonvolatile variable resistance element comprising:
a first electrode;
a second electrode including a metal element;
a variable resistance layer arranged between the first electrode and the second electrode having a semiconductor element; and
a hydroxide layer inserted between the second electrode and the variable resistance layer, the hydroxide layer having a hydroxide of the metal element.

14. The nonvolatile variable resistance element according to claim 13, wherein the variable resistance layer is polycrystal silicon, amorphous silicon, or monocrystal silicon.

15. The nonvolatile variable resistance element according to claim 13, wherein the hydroxide layer is selected out of AgOH, $Mg(OH)_2$, $Fe(OH)_2$, $Zn(OH)_2$, $Al(OH)_3$, and $CU(OH)_2$.

16. The nonvolatile variable resistance element according to claim 13, wherein the first electrode is impurity-doped silicon.

17. The nonvolatile variable resistance element according to claim 13, wherein the metal element is selected out of Ag, Ti, Ni, Co, Al, Cr, Cu, W, Hf, Ta, Au, Bi and Zr.

18. The nonvolatile variable resistance element according to claim 13, wherein a laminated structure of the first electrode, the variable resistance layer, the dielectric layer, and the second electrode is arranged at a cross point of a word line and a bit line.

19. The nonvolatile variable resistance element according to claim 18, further comprising a rectifying element arranged between the word line and the bit line.

20. A nonvolatile variable resistance element comprising:
a first electrode;
a second electrode including Ag;
a variable resistance layer arranged between the first electrode and the second electrode and having a semiconductor element; and
a silver hydroxide layer inserted between the second electrode and the variable resistance layer.

21. The nonvolatile variable resistance element according to claim 20, wherein the variable resistance layer is polycrystal silicon, amorphous silicon, or monocrystal silicon.

22. The nonvolatile variable resistance element according to claim 20, wherein the first electrode is impurity-doped silicon.

23. The nonvolatile variable resistance element according to claim 20, wherein a laminated structure of the first electrode, the variable resistance layer, the silver hydroxide layer, and the second electrode is arranged at a cross point of a word line and a bit line.

24. The nonvolatile variable resistance element according to claim 23, further comprising a rectifying element arranged between the word line and the bit line.

25. A nonvolatile variable resistance element comprising:
a first electrode;
a second electrode including Cu;
a variable resistance layer arranged between the first electrode and the second electrode and having a semiconductor element; and
a copper hydroxide layer inserted between the second electrode and the variable resistance layer.

26. The nonvolatile variable resistance element according to claim 25, wherein the variable resistance layer is polycrystal silicon, amorphous silicon, or monocrystal silicon.

27. The nonvolatile variable resistance element according to claim 25, wherein the first electrode is impurity-doped silicon.

28. The nonvolatile variable resistance element according to claim 25, wherein a laminated structure of the first electrode, the variable resistance layer, the copper hydroxide layer, and the second electrode is arranged at a cross point of a word line and a bit line.

29. The nonvolatile to claim 28, further arranged between the variable resistance element according comprising a rectifying element word line and the bit line.

* * * * *